(12) United States Patent
Yung et al.

(10) Patent No.: US 7,741,987 B2
(45) Date of Patent: Jun. 22, 2010

(54) DUAL GATE OXIDE ANALOG CIRCUIT ARCHITECTURE WITH DUAL VOLTAGE SUPPLIES AND ASSOCIATED METHOD

(75) Inventors: Henry Tin-Hang Yung, Hsin-Chu County (TW); Chao-Ping Huang, Hsin-Chu (TW); Steve Wiyi Yang, Hsin-Chu Hsien (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 0 days.

(21) Appl. No.: 12/328,770

(22) Filed: Dec. 5, 2008

(65) Prior Publication Data

US 2009/0079604 A1 Mar. 26, 2009

Related U.S. Application Data

(63) Continuation of application No. 11/535,488, filed on Sep. 27, 2006, now abandoned.

(60) Provisional application No. 60/597,390, filed on Nov. 29, 2005.

(51) Int. Cl.
*H03M 1/38* (2006.01)

(52) U.S. Cl. ................................. 341/161; 326/30

(58) Field of Classification Search .......... 341/140–170
See application file for complete search history.

(56) References Cited

U.S. PATENT DOCUMENTS

| 5,880,690 | A | 3/1999 | Rothenberg |
| 6,075,686 | A | 6/2000 | Ker |
| 6,166,580 | A | 12/2000 | Sessions |
| 6,369,613 | B1 | 4/2002 | Costello |
| 6,509,854 | B1 | 1/2003 | Morita |
| 6,642,543 | B1 * | 11/2003 | El Gamal et al. ............ 257/72 |

FOREIGN PATENT DOCUMENTS

TW 200507462 2/2005

* cited by examiner

*Primary Examiner*—Lam T Mai
(74) *Attorney, Agent, or Firm*—Winston Hsu

(57) ABSTRACT

An analog circuit architecture is fabricated with dual gate oxides and dual voltage supplies. In the analog circuit architecture, different kinds of devices/transistors with different gate oxide thicknesses are biased by different voltages, such that advantages of each device technology are mixed to enhance total performance of the analog circuit. For example, thin oxide 0.18 um transistors are biased at 1.8V for higher speed and lower power consumption, whereas thick oxide 0.35 um transistors are biased at 3.3V for a wider signal swing range.

11 Claims, 6 Drawing Sheets

US 7,741,987 B2

DUAL GATE OXIDE ANALOG CIRCUIT ARCHITECTURE WITH DUAL VOLTAGE SUPPLIES AND ASSOCIATED METHOD

CROSS REFERENCE TO RELATED APPLICATIONS

This application is a continuation of U.S. patent application Ser. No. 11/535,488, filed Sep. 27, 2006, which claims the benefit of U.S. Provisional Application No. 60/597,390, filed Nov. 29, 2005, both of which are included herein by reference.

BACKGROUND OF THE INVENTION

1. Field of the Invention

The present invention relates to integrated circuit architectures, and particularly, the present invention relates to an analog integrated circuit fabrication architecture with multiple oxide thicknesses and multiple bias voltages, and its related method.

2. Description of the Prior Art

In the modern information society, electronics are used to process, output, and store all kinds of audio and video media. Thus, research in electronics has focused on all kinds of circuits and architectures for processing multimedia electronic signals. As anyone familiar with the art would know, signal processing circuits are typically categorized by digital circuits and analog circuits. And, though the development of new digital circuits is rapid, and maturing every day, the importance of analog circuits (including mixed-signal circuits) has not decreased, but is ever greater than before. For example, in order to digitize robust audio and video, while retaining high quality and low loss, a high-performance, high-speed analog-to-digital converter (ADC) is required, and that ADC is one type of analog (mixed-signal) circuit. Likewise, electronic signals that are transmitted at high speeds (such as high-speed wireless internet signals) and electronic signals accessed from storage devices (such as a disc), all require processing by analog or mixed-signal circuits. In fact, all signals, regardless of being classified as digital or analog, are essentially analog signals, and analog electronic circuits are able to control the analog portions of electronic signals. Thus, developing high-performance, high-speed analog circuits and architectures is a major concern of modern information technology companies.

Anyone familiar with the art knows that traditional digital signals use different signal amplitudes to communicate information. For example, if the signal amplitude is lower than a certain value, then the information is "0", whereas if the signal amplitude is higher than another value, the information is "1". Analogously, a signal amplitude of analog signals also represents unique information. Information carried in the analog signal also changes as the signal amplitude of the analog signal rises from low to high. And thus, analog circuits typically stress an ability to process signals with a large amplitude swing or range. In other words, compared with digital circuits, analog circuits and, more importantly, analog circuit architectures should be able to accept a larger signal swing, so as to better process the information in the analog signal. Of course, a critical limiting factor in achieving large swing analog circuits is a bias voltage of the analog circuit. Typically, the larger the bias voltage of the analog circuit, the larger the allowable signal swing. Thus, in the prior art still used in industry, analog circuits are usually biased at a higher voltage than digital circuits.

Generally speaking, circuits biased at higher voltages require architectures with larger geometry devices, such as thick gate oxide metal-oxide-semiconductor (MOS) transistors. Thick gate oxide devices are better able to withstand a high bias voltage environment. However, large geometry thick gate oxide devices have significant disadvantages when used in analog circuits. First, large geometry devices are slower, i.e. have a lower unity gain frequency $f_t$. Large geometry devices also take up more real estate in layout, and drain more power during operation. In order to improve circuit speeds, the industry has tried to introduce scaled down small geometry devices, such as thin gate oxide MOS transistors, to analog circuit architectures. These small geometry devices are faster, require less real estate, and consume less power.

Please refer to FIG. 1 for further explanation of this prior art. FIG. 1 is a block diagram of an analog circuit architecture of the prior art, which could for example be a mixed-technology, dual gate analog-to-digital converter (ADC) 100. In the analog circuit architecture, the prior art adopts a single bias voltage environment (such as 3.3V). Thus, most devices in the architecture are thick gate oxide devices suited to the higher bias voltage environment. One example of the devices suited to a 3.3V bias voltage would be 0.35 um MOS transistors. In FIG. 1, a first circuit 120 and a second circuit 140 are both formed of thick gate oxide devices of this type. Yet, to make up for the relatively slower speed of the thick gate oxide devices, the prior art also includes a minority of thin gate oxide devices, such as 0.18 um MOS transistors. A third circuit 160 is made up of such thin gate oxide small geometry devices.

Although the circuit architecture of FIG. 1 attempts to introduce small geometry devices, as one familiar with the art would know, thin gate oxide transistors typically are more suited to lower bias voltage environments. For example, a gate oxide layer of thin oxide transistors is relatively thinner, and cannot withstand large signals in a high bias voltage environment, but can only be used in a relatively lower bias voltage environment. However, as shown in FIG. 1, because the circuit architecture of the prior art only provides the high bias voltage, when small geometry devices are introduced, these thin gate oxide transistors must be protected by large geometry devices, and cannot be connected directly to the bias voltage. In other words, 0.18 um small geometry devices, which are typically biased at 1.8V, cannot be directly connected to 3.3V, but instead must be protected by 0.35 um devices before the 0.18 um devices can operate correctly. In this way, small geometry devices are limited in their scope of use in analog IC design. Small geometry devices cannot be used extensively, and thus cannot make a large impact on the overall effectiveness of analog circuits.

SUMMARY OF THE INVENTION

The present invention provides a new analog circuit architecture and related method, which provide different bias voltages to target different geometry devices, allowing small scale devices and large scale devices to bring into play their respective strengths, thereby increasing overall effectiveness of analog circuits, and overcoming the disadvantages of the analog circuit architecture of the prior art.

The present invention also teaches a multiple bias, multi-gate analog circuit architecture. The architecture comprises a plurality of first devices biased at a first voltage, and a plurality of second devices biased at a second voltage, the second voltage being essentially different from the first voltage. For example, the first devices could be thin-oxide transistors, such as 0.18 um devices, and the first voltage could be a low voltage, such as 1.8V. The second devices could be thick-oxide transistors, such as 0.35 um devices, and the second voltage could be a higher voltage, such as 3.3V. In other words, the first devices could be 0.18 um thin-oxide metal-oxide-semiconductor (MOS) transistors fabricated according to the 0.18 um standard. And, the second devices could be thick-oxide MOS transistors that conform to the 0.35 um standard, but are fabricated in the same process with the first devices, at different steps in the process.

Because the present invention provides different bias voltages for different geometry devices, the architecture is able to fully use devices of different geometries, allowing the devices of different geometries to bring out their unique characteristics, i.e. thin-oxide transistors' high speed and low power consumption, and thick-oxide transistors' high voltage swing capabilities. Without sacrificing signal swing range, the present invention analog circuit architecture (including analog/digital mixed signal circuits) fully exploits the unique characteristics of thin-oxide devices to improve signal processing effectiveness, while also reducing power consumption and die area. The present invention circuit architecture realizes high-performance analog circuits, including analog/digital mixed-signal circuits, for receiving, transmitting, and processing analog signals, one example of which being an analog-to-digital converter.

The present invention also teaches a signal processing circuit comprising a plurality of pipeline modules, each of which module further comprises a plurality of first devices biased at a first voltage and a plurality of second devices biased at a second voltage, the second voltage being essentially different from the first voltage. As described above, the first devices could be thin-oxide transistors, such as 0.18 um devices, biased at 1.8V, and the second devices could be thick-oxide transistors, such as 0.35 um devices, biased at 3.3V. More specifically, each pipeline module can use a plurality of the first devices and a plurality of the second devices to form an input circuit biased at the first voltage and the second voltage, respectively, and an output circuit biased at the first voltage and the second voltage, respectively. Further, a core circuit biased at the first voltage can be formed of a plurality of the first devices. The input circuit and the output circuit can receive and transmit high swing signals, respectively. And, the core circuit, which is connected between the input circuit and the output circuit can be used to perform signal processing on the signal received from the input circuit, and transmit the processed signal to the output circuit. The signal processing circuit described above is an analog circuit, including analog/digital mixed-signal circuits, which can receive, transmit, and process analog signals.

For example, in each pipeline module, a sample/hold (S/H) circuit and an output amplifier can be formed of pluralities of the first small geometry devices and pluralities of the second large geometry devices, and a core circuit can be formed of a plurality of the first small geometry devices. The S/H circuit and the output amplifier respectively act as the input circuit and the output circuit mentioned above, and respectively receive and transmit high swing signals. The core circuit is connected between the S/H circuit and the output amplifier, and is used to perform signal processing on the signal received by the S/H circuit, and to output the resulting processed signal through the output amplifier. More specifically, the core circuit can comprise an ADC module formed by a plurality of the first small geometry devices, a digital-to-analog converter (DAC) module formed by a plurality of the first small geometry devices, and a signal combiner circuit formed by a plurality of the first small geometry devices. The ADC module can provide a digital signal based on the output of the S/H circuit. The DAC module can provide an analog signal, based on the digital signal, to be outputted by the output amplifier circuit. And, the signal combiner circuit can realize an addition node, which can combine the analog signal with the S/H circuit output through a subtraction operation performed by a subtractor.

In coordination with the pipeline module described above, the pipeline ADC can further comprise a plurality of delay circuits, and an error correction circuit. Each delay circuit corresponds to one of the plurality of pipeline modules, and can be used to delay the digital signal of the pipeline module. The error correction circuit can generate a digital output signal based on the output signals of the plurality of delay circuits. Using the architecture taught by the present invention, the ADC can take advantage of the respective strengths of small geometry devices and large geometry devices. Not only does the ADC exhibit a large signal swing, but the ADC also uses the higher speed and lower power consumption of small geometry devices to increase the overall effectiveness of the circuit. In this example, the ADC according to the present invention architecture exhibits a 20% increase in processing speed, and a 30% reduction in power consumption.

The present invention also teaches a method of realizing, including designing and fabricating, an analog circuit. First, a plurality of different devices is realized in the analog circuit. Then, a plurality of different voltage sources is realized in the analog circuit. Finally, the plurality of different devices is biased by the plurality of different voltage sources. In the steps described above, the different devices realized are different oxide thickness MOS transistors. Equivalently, the different devices realized are devices of different geometries. In other words, the different devices are fabricated in different steps of one process. For example, in a 0.18 um process, 0.35 um devices (thick oxide transistors) could be fabricated first, and 0.18 um devices (thin oxide transistors) could be fabricated second. For the different devices, the present invention method provides different bias voltages, such as 3.3V for the 0.35 um devices, and 1.8V for the 0.18 um devices. In this way, both the 0.35 um devices and the 0.18 um devices can bring their respective strengths to bear in the analog circuit, increasing the overall effectiveness of the analog circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
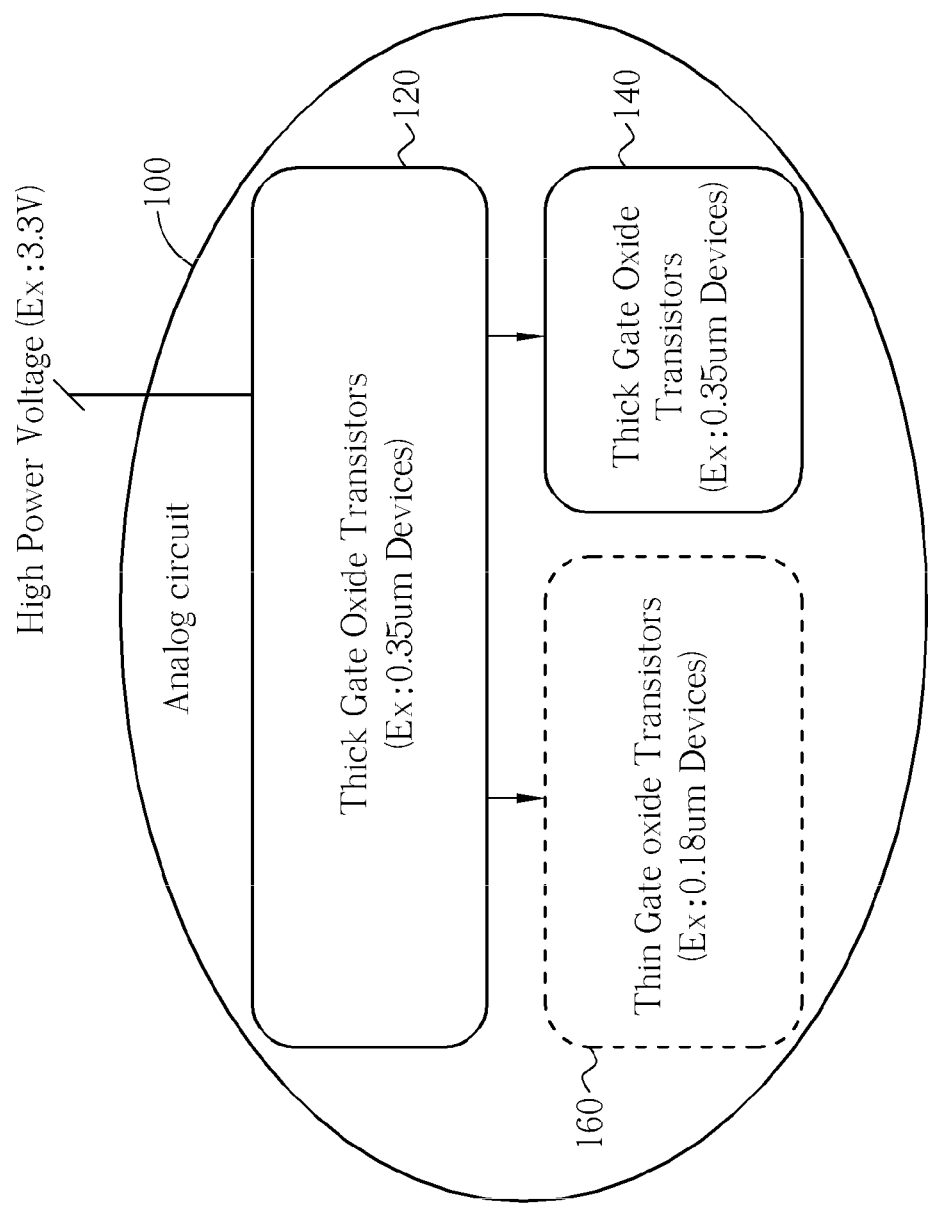
FIG. 1 is a diagram of an analog-to-digital converter in an analog circuit architecture according to the prior art.
Figure 2:
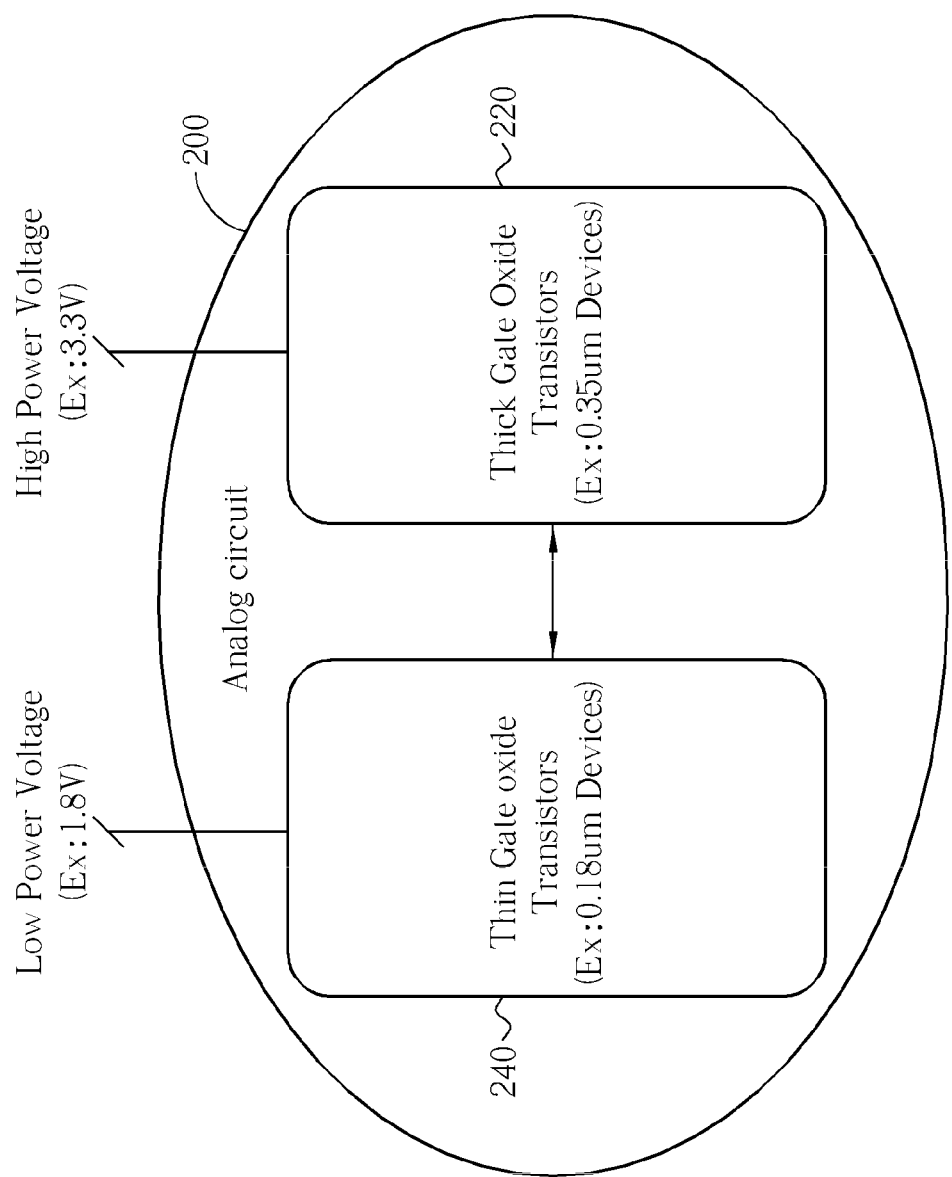
FIG. 2 is a diagram of an analog circuit architecture according to the present invention.

Please refer to FIG. 2, which is a diagram of an analog circuit 200 according to the present invention architecture.

The analog circuit 200 comprises a plurality of transistors with different oxide thicknesses, and provides different bias voltages for each type of transistor, such that each type of transistor can be used to its fullest potential. As shown in the example of FIG. 2, the analog circuit 200 can comprise large geometry, thick oxide devices and small geometry, thin oxide devices, so as to design a dual-gate analog circuit with the two different device types. Corresponding to the two device types, the analog circuit 200 provides two different bias voltages. A lower bias voltage is given to the thin oxide devices, whereas a higher bias voltage is given to the thick oxide devices. A circuit 240 comprising a plurality of the thin oxide devices is biased at the lower bias voltage. A circuit 220 comprising a plurality of the thick oxide devices is biased at the higher voltage. The circuit 220 could also be a mixed technology circuit, further comprising a plurality of the thin oxide devices. Under this biasing scheme, the circuit 240 can exploit a higher speed and lower power consumption of the small geometry devices. Whereas, the circuit 220 can exploit a higher signal swing range of the large geometry devices.

Speaking in terms of the practical example, the small geometry devices of FIG. 2 could be 0.18 um devices, such as thin gate oxide MOS transistors, which can be biased at the lower bias voltage of 1.8V. At this lower bias voltage, 0.18 um devices can be directly connected to the 1.8V bias voltage source to draw bias power, without having to connect to the bias source through thick gate oxide, large geometry devices. Thus, the analog circuit architecture of the present invention can employ greater numbers of small geometry devices to improve the overall effectiveness of the analog circuit, increasing speed, lowering power consumption, decreasing layout area, and improving device integration. Likewise, the large geometry devices can be 0.35 um devices, such as thick gate oxide MOS transistors, fabricated in a 0.18 um process, and directly biased at the higher bias voltage of 3.3V. Under this higher bias voltage, the analog circuit using the large geometry devices can accept signals with higher swing range, and bring in information corresponding to that range.

Figure 3:
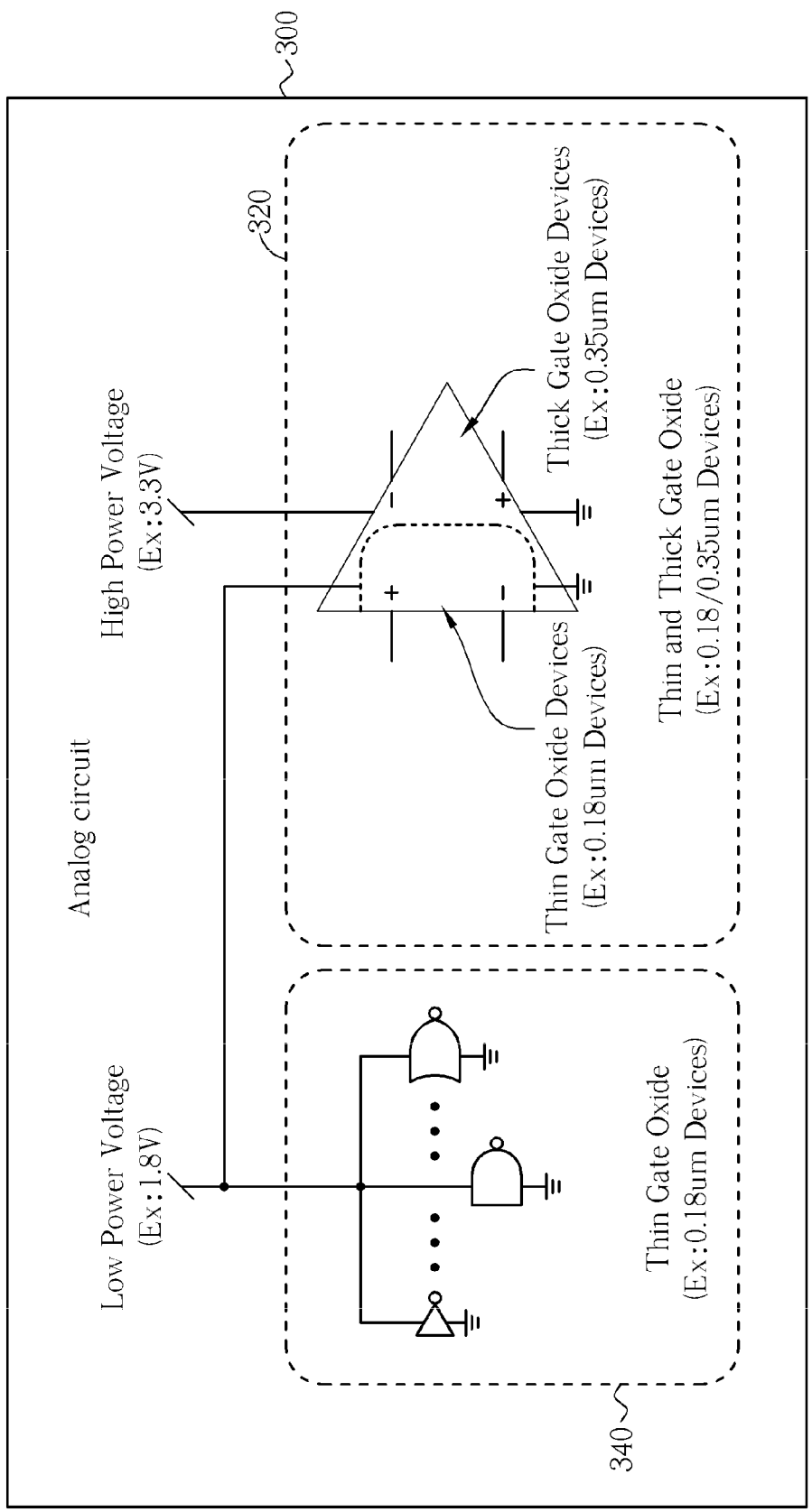
FIG. 3 is a circuit block diagram of the analog circuit architecture according to the present invention.

Please refer to FIG. 3, which is a circuit block diagram of the analog circuit architecture of the present invention. An analog circuit 300 comprises a logic block 340. The logic block 340 comprises logic gates, such as inverters, which are formed preferably of small geometry, thin oxide devices, such as 0.18 um transistors. The small geometry devices are biased at a lower voltage of 1.8V. Blocks with analog-related functions, such as a circuit 320, can be formed of a mix of thick oxide transistors and thin oxide transistors. Likewise, these pipeline modules 320 use a mix of the higher voltage (3.3V) and the lower voltage (1.8V) to appropriately bias the thick oxide transistors and the thin oxide transistors, respectively. For example, the circuit 320 can comprise an analog amplifier, such as a differential amplifier or an operational amplifier. First stages of amplifier can be formed of small geometry devices and biased at the lower bias voltage, whereas later stages of the amplifier can be formed of large geometry devices and biased at the higher bias voltage. In this manner, the amplifier can handle both higher speed and larger output signal swing.

As can be seen from the discussion of FIG. 3, the present invention not only uses small geometry devices with a low bias voltage in a logic section of an analog circuit, but also makes appropriate use, conditions allowing, of the small geometry devices with the low bias voltage in analog blocks, such as the amplifier mentioned above. This improves an effectiveness of the analog circuit, making the circuit architecture of the present invention faster, higher performance, and less power hungry, without giving up a high bias voltage for handling high swing input and output signals.

Figure 4:
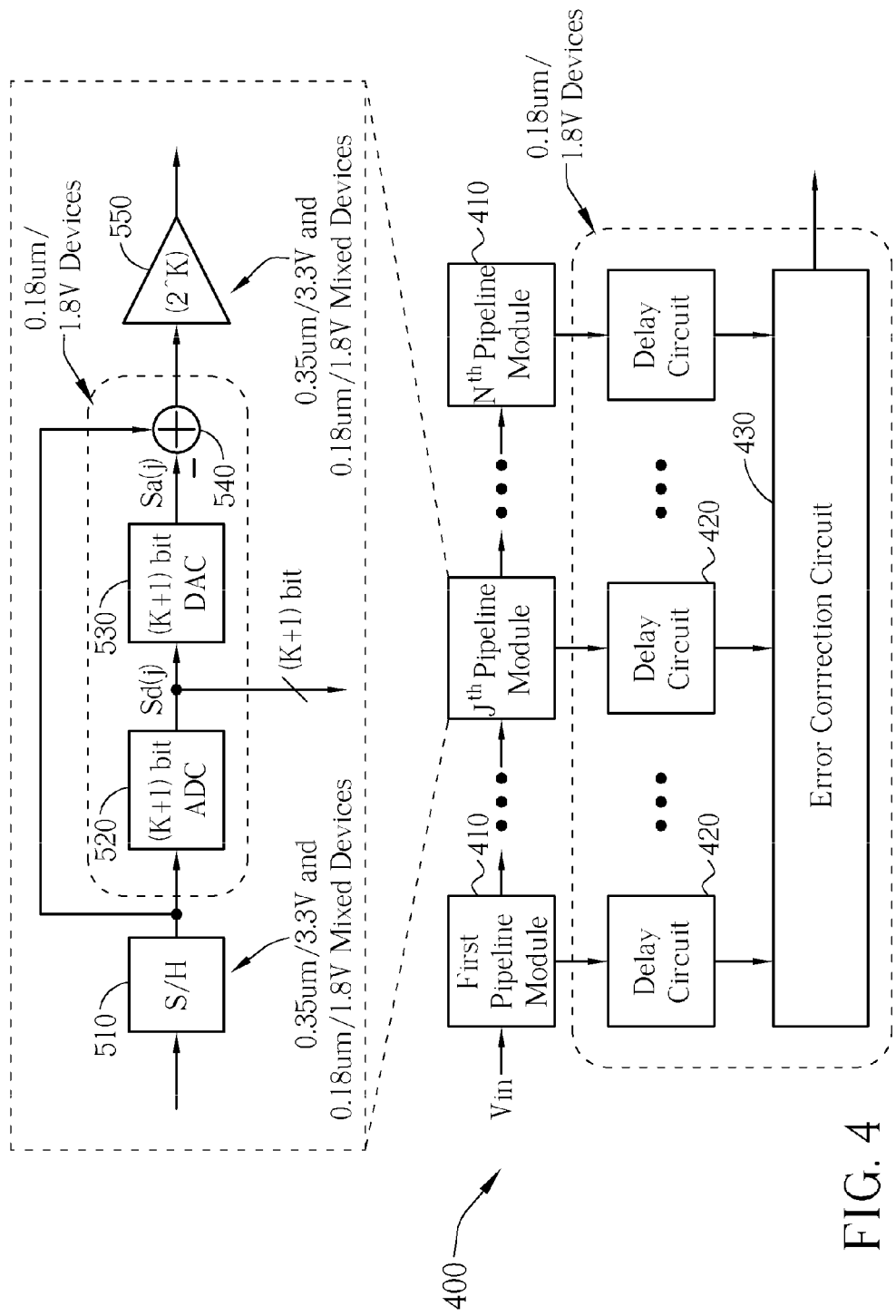
FIG. 4 is a diagram of an analog-to-digital converter in the analog circuit architecture according to the present invention.

The analog circuit of FIG. 3 can be an analog-to-digital converter (ADC). For a more detailed description of how to use the present invention architecture to develop a high-performance ADC, please refer to FIG. 4. FIG. 4 uses a pipeline ADC 400 as an example. The pipeline ADC 400 comprises a plurality (stage 1 through stage N) of pipeline modules 410 connected in series. Each pipeline module 410 can receive an input signal, generate an output signal by processing the input signal, and output the output signal. The j-th pipeline module 410 receives an analog signal from the pipeline module 410 preceding the j-th pipeline module 410, and passes a processed analog signal to the pipeline module 410 following the j-th pipeline module 410. An analog input signal Vin is processed by the pipeline module 410 that is at the beginning of the series. Each pipeline module 410 comprises a sample/hold (S/H) circuit 510, an ADC module 520, a digital-to-analog converter (DAC) module 530, a signal combiner circuit 540, and an output amplifier 550. The S/H circuit 510 can be seen as an input circuit of the pipeline module 410, and is used to sample the analog output signal from the pipeline module 410 directly preceding in the series. The ADC module 520, the DAC module 530, and the combiner circuit 540 together form a core circuit of the architecture. The resulting sample of the S/H circuit 510 is converted into a K+1 bit digital signal Sd(j), where K is a constant, by the ADC module 520. The digital signal Sd(j) is then converted into an analog signal Sa(j) by the DAC module 530. Finally, the signal combiner circuit 540, which can be a summer node, subtracts the output of the S/H circuit 510 and the analog signal Sa(j). The output signal of the combiner circuit 540 is sent to the pipeline module 410 immediately following, by way of the output amplifier 550. The output amplifier 550 can be considered an output circuit of the pipeline module 410.

Corresponding to each pipeline module 410, the ADC 400 further comprises a plurality of delay circuits 420. The delay circuits 420 can delay the digital signal of the corresponding pipeline module 410, and send the delayed signal to an error correction circuit 430. Based on the plurality of delay signals from the delay circuits 420, the digital error correction circuit 430 can output a digital value representing a magnitude of the analog input signal Vin.

In the ADC 400 of the present invention circuit architecture, the plurality of delay circuits 420 and the error correction circuit 430 are preferably formed of small geometry devices, such as 0.18 um thin oxide transistors biased at 1.8V. The plurality of pipeline modules 410, and correspondingly the S/H circuit 510 and the output amplifier 550, are preferably formed of a mix of the small geometry devices and the large geometry devices. In other words, these two circuits are preferably built of a mix of different geometry devices biased at different voltages, such as 0.18 um -thin oxide transistors biased at 1.8V and 0.35 um thick oxide transistors biased at 3.3V. Regarding the core circuit of each pipeline module 410, which core circuit comprises the ADC module 520, the DAC module 530, and the signal combiner circuit 540, these circuits are preferably formed of the small geometry, low bias voltage devices, such as 0.18 um thin oxide transistors biased at 1.8V, and the small geometry devices are preferably connected directly to the low voltage bias. In such a manner, the small geometry devices can bring to bear their faster speed and lower power consumption to improve signal processing performance. Likewise, the large geometry devices biased at the higher voltage are able to tolerate and process higher signal swing analog signals. By combining these advantages, the present invention circuit architecture is able to realize a high-efficiency, low-power, high performance ADC and many other types of analog circuit. For example, compared with an ADC of the prior art, the present invention ADC exhibits a 20% increase in processing speed, while consuming 30% less power.

Figure 5:
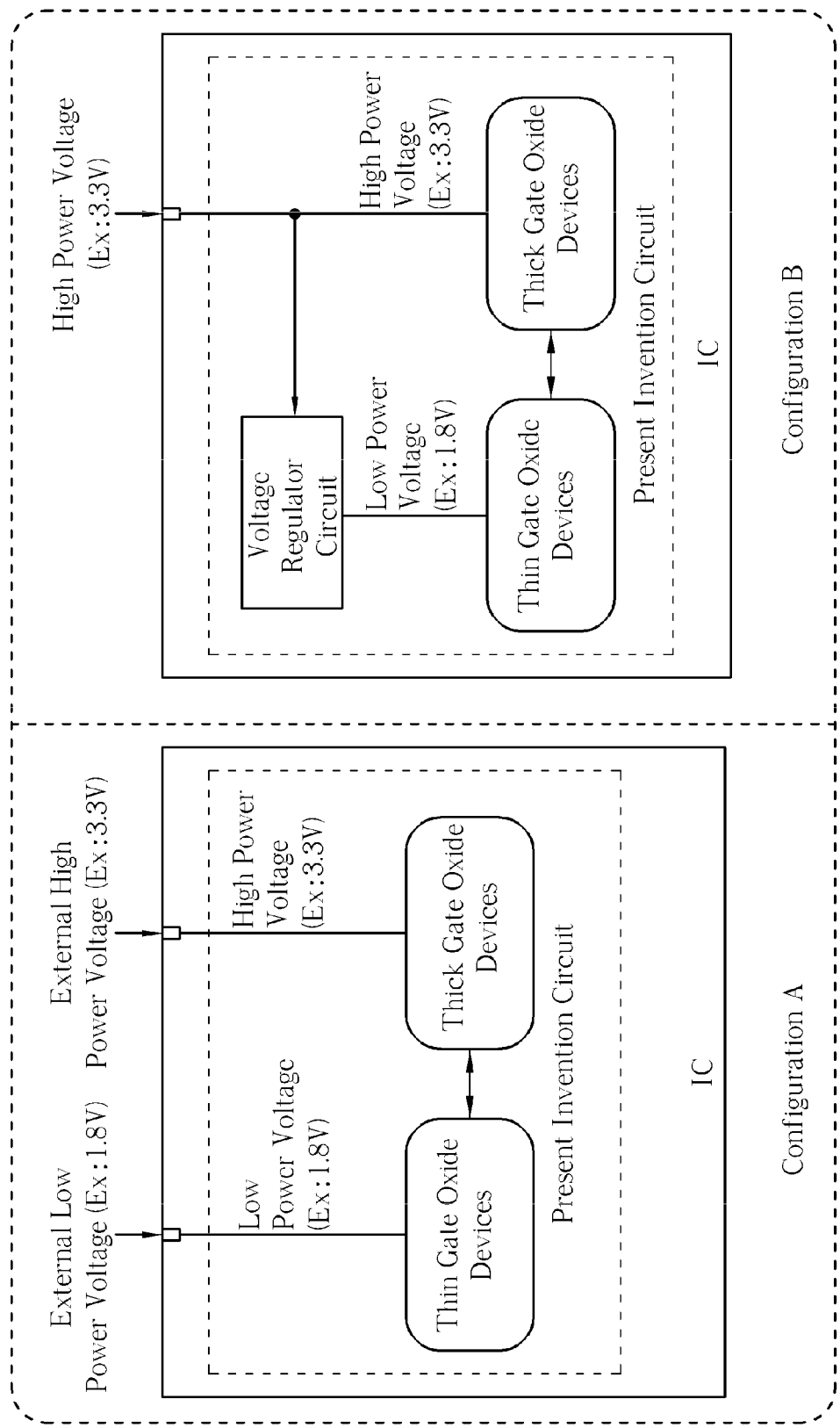
FIG. 5 is a diagram of different configurations for providing different bias voltages to different geometry devices in the analog circuit architecture according to the present invention.

When the present invention architecture is realized in an integrated circuit (IC), many different biasing schemes can be used to provide the small geometry devices with a lower bias voltage and the large geometry devices with a higher bias voltage. Please refer to FIG. 5, which shows two different embodiments of a dual bias voltage biasing scheme of the present invention architecture. In a configuration A, the IC can be powered by a plurality of external power sources at a corresponding plurality of ports. The ports could be realized as any combination of power pins, power pads, and power balls. Each independent port is connected to a different external bias power supply, and the different geometry devices of the present invention circuit architecture can get their bias power from the respective bias ports. Generally speaking, when the IC is placed on a printed circuit board (PCB), the PCB typically comprises voltage regulator circuits, or a voltage regulator IC, for providing different voltage bias supplies. So, the IC in the configuration A can directly draw its bias from the externally connected voltage regulators through the bias ports.

In another configuration B, the IC can comprise a single external voltage bias port that is connected to a signal external bias voltage source. The IC can further comprise an internal voltage regulator circuit, which generates a plurality of bias voltages from the single external bias voltage through the external voltage bias port, so as to provide different bias voltages for the different geometry devices. In the configuration B, a single 3.3V bias is provided to the IC through the external voltage bias port, and the internal voltage regulator circuit uses the 3.3V bias to further generate a plurality of bias voltages, such as a 1.8V bias. In this way, the present invention circuit can directly bias the large geometry 0.35 um devices with the 3.3V bias, and the small geometry 0.18 um devices with a 1.8V bias through the internal voltage regulator circuit.

Figure 6:
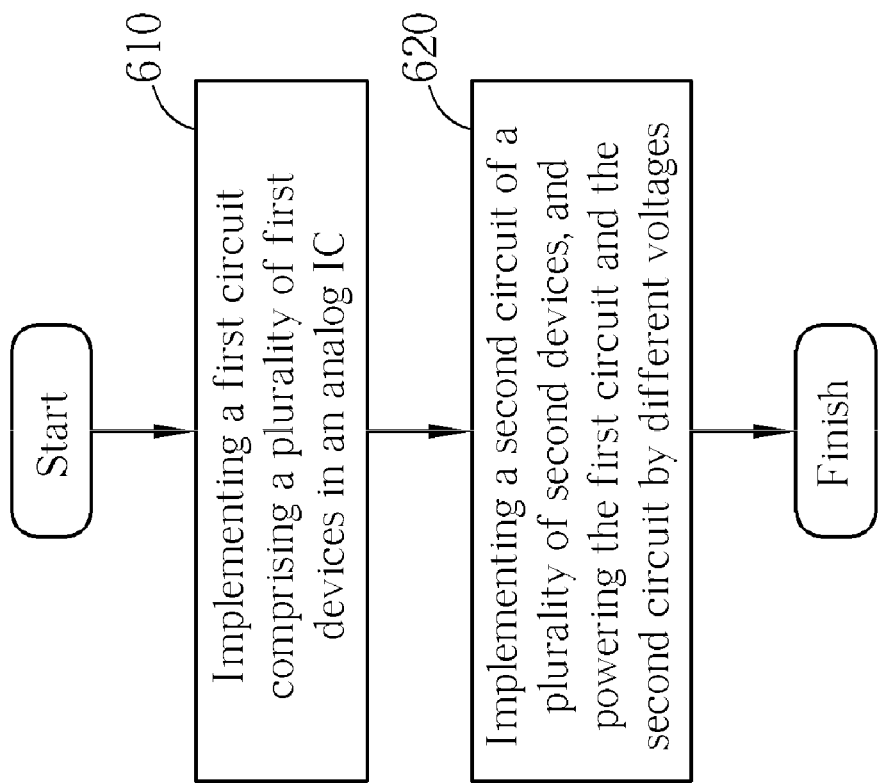
FIG. 6 is a flow chart of a method of realizing an analog integrated circuit according to the preferred embodiment of the present invention.

Please refer to FIG. 6, which is a flow chart showing a method of forming an analog integrated circuit according to a preferred embodiment of the present invention. In step 610, a first circuit comprising a plurality of first devices is formed in an analog integrated circuit (IC). In step 620, a second circuit comprising a plurality of second devices is formed in the analog IC. The first circuit and the second circuit are biased at different voltages. The first devices and the second devices are fabricated in different fabrication steps in a single fabrication process. For instance, in a 0.18 um process, the first circuit comprises a plurality of 0.18 um devices, the second circuit comprises a plurality of 0.35 um devices, the first circuit is directly biased at 1.8V, and the second circuit is directly biased at 3.3V.

In summary, the present invention teaches an analog circuit architecture in which devices with different oxide thicknesses are fabricated in different steps of a single fabrication process, and biased with different corresponding bias voltages. In the prior art, an analog circuit comprising large geometry devices is biased at a high bias voltage. Even if a minority of small geometry devices is introduced to the prior art circuit, because the small geometry devices are biased in the same high voltage bias environment, the small geometry devices are limited in their performance. Thus, the prior art circuit cannot use the small geometry devices extensively, nor can the prior art take advantage of a higher speed and lower power consumption of the small geometry devices. In contrast, the present invention analog circuit architecture can employ both large geometry and small geometry devices, biasing each with a respective proper bias voltage, so as to remove the limitations on usage of the small geometry devices. In this way, the present invention analog circuit can use the small geometry devices extensively to take advantage of the strengths of the small geometry devices as related to the overall performance of the analog circuit. In addition, the analog circuit can also take advantage of the large geometry devices so as to tolerate higher signal swing at inputs and outputs of the analog circuit. Thus, without reducing the allowable signal swing, the analog circuit also exhibits increased performance, reduced power consumption, reduced layout area, and increased integration. In the 0.18 um process, both 0.18 um devices and 0.35 um devices are provided. As discussed in each of the embodiments described above, the present invention uses 1.8V and 3.3V to bias the 0.18 um and 0.35 um devices, respectively, thus improving the performance of the analog circuit. As semiconductor processes improve, the present invention method of providing devices with different gate oxide thicknesses will allow analog circuits to display strengths associated with each type of device, thus improving the overall performance of the circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-power multi-gate-oxide pipeline analog-to-digital converter (ADC) comprising:
a plurality of pipeline modules, each pipeline module comprising:
a plurality of first devices powered by a first voltage;
a plurality of second devices powered by a second voltage,
wherein the second voltage is different from the first voltage;
an input circuit;
an output circuit; and
a core circuit,
wherein the ADC is an analog circuit for processing an analog signal, the input circuit and the output circuit comprise a first portion of the first devices and the second devices, the core circuit comprises a second portion of the first devices, the input circuit and the output circuit respectively receive and transmit a high-swing signal, and the core circuit is connected between the input circuit and the output circuit for signal processing of the high-swing signal received from the input circuit.

2. The multi-power multi-gate-oxide pipeline analog-to-digital converter of claim 1, wherein the first devices are thin-gate-oxide metal-oxide-semiconductor (MOS) transistors, the second devices are thick-gate-oxide MOS transistors, and the second voltage is higher than the first voltage.

3. The multi-power multi-gate-oxide pipeline analog-to-digital converter of claim 1, wherein the first devices and the second devices are formed in one process but undergo different process steps.

4. The multi-power multi-gate-oxide pipeline analog-to-digital converter of claim 1 being implemented on a single substrate.

5. A multi-power multi-gate-oxide pipeline analog-to-digital converter comprising:
a plurality of pipeline modules, each pipeline module comprising:

a plurality of first devices powered by a first voltage;
a plurality of second devices powered by a second voltage,
    wherein the second voltage is different from the first voltage;
a sample/hold circuit,
an output amplifier; and
a core circuit,
    wherein the sample/hold circuit and the output amplifier comprise a first portion of the first devices and the second devices, a core circuit comprises a second portion of the first devices, the sample/hold circuit and the output amplifier receive and transmit a high-swing signal respectively, and the core circuit is connected between the sample/hold circuit and the output amplifier for processing the high-swing signal received from the sample/hold circuit.

6. The multi-power multi-gate-oxide pipeline analog-to-digital converter of claim 5, wherein the core circuit comprises:
    an ADC module for generating a digital signal based on an output signal from the sample/hold circuit;
    a digital-to-analog converter for converting the digital signal to an analog signal; and
    a synthesizer for synthesizing the analog signal and the output signal of the sample/hold circuit.

7. The multi-power multi-gate-oxide pipeline analog-to-digital converter of claim 5 further comprising:
    a plurality of delay circuits corresponding to the plurality of pipeline modules, each delay circuit delaying a digital signal from the corresponding pipeline module; and
    a digital error correction circuit for generating a digital output signal according to the delayed digital signals of the delay circuits.

8. The multi-power multi-gate-oxide pipeline analog-to-digital converter of claim 7, wherein each delay circuit and the error correction circuit comprise a plurality of the first devices.

9. The multi-power multi-gate-oxide pipeline analog-to-digital converter of claim 5, wherein the first devices are thin-gate-oxide metal-oxide-semiconductor (MOS) transistors, the second devices are thick-gate-oxide MOS transistors, and the second voltage is higher than the first voltage.

10. The multi-power multi-gate-oxide pipeline analog-to-digital converter of claim 5, wherein the first devices and the second devices are formed in one process but undergo different process steps.

11. The multi-power multi-gate-oxide pipeline analog-to-digital converter of claim 5 being implemented on a single substrate.

* * * * *